United States Patent [19]

Sabo et al.

[11] 4,413,327

[45] Nov. 1, 1983

[54] RADIATION CIRCUMVENTION TECHNIQUE

[75] Inventors: Joseph D. Sabo, Belmont, Mass.; Joel A. Karp, Cupertino, Calif.

[73] Assignee: The United States of America as represented by the Secretary of the Navy, Washington, D.C.

[21] Appl. No.: 59,794

[22] Filed: Jun. 9, 1970

[51] Int. Cl.³ .............................................. G06F 1/00
[52] U.S. Cl. ................................... 364/900; 364/200; 371/10
[58] Field of Search ............ 235/61.5 E, 61.11, 150.2; 340/150.2, 172.5; 364/200 MS File, 900 MS File; 371/10

[56] References Cited

U.S. PATENT DOCUMENTS 3,409,879 11/1968 Keister ............................ 340/172.5
3,533,082 10/1970 Schnabel et al. ................ 340/172.5

Primary Examiner—S. C. Buczinski
Attorney, Agent, or Firm—Robert F. Beers; Arthur A. McGill; Prithvi C. Lall

[57] ABSTRACT

A method and apparatus for eliminating the effects of ionizing radiation on a computer system are disclosed in which two redundant storage units are alternately addressed and updated in rapid succession so that each storage unit alternately carries information unaffected by the radiation. After the radiation has ceased, this unaffected unit is located and its information read back into the computer system.

5 Claims, 1 Drawing Figure

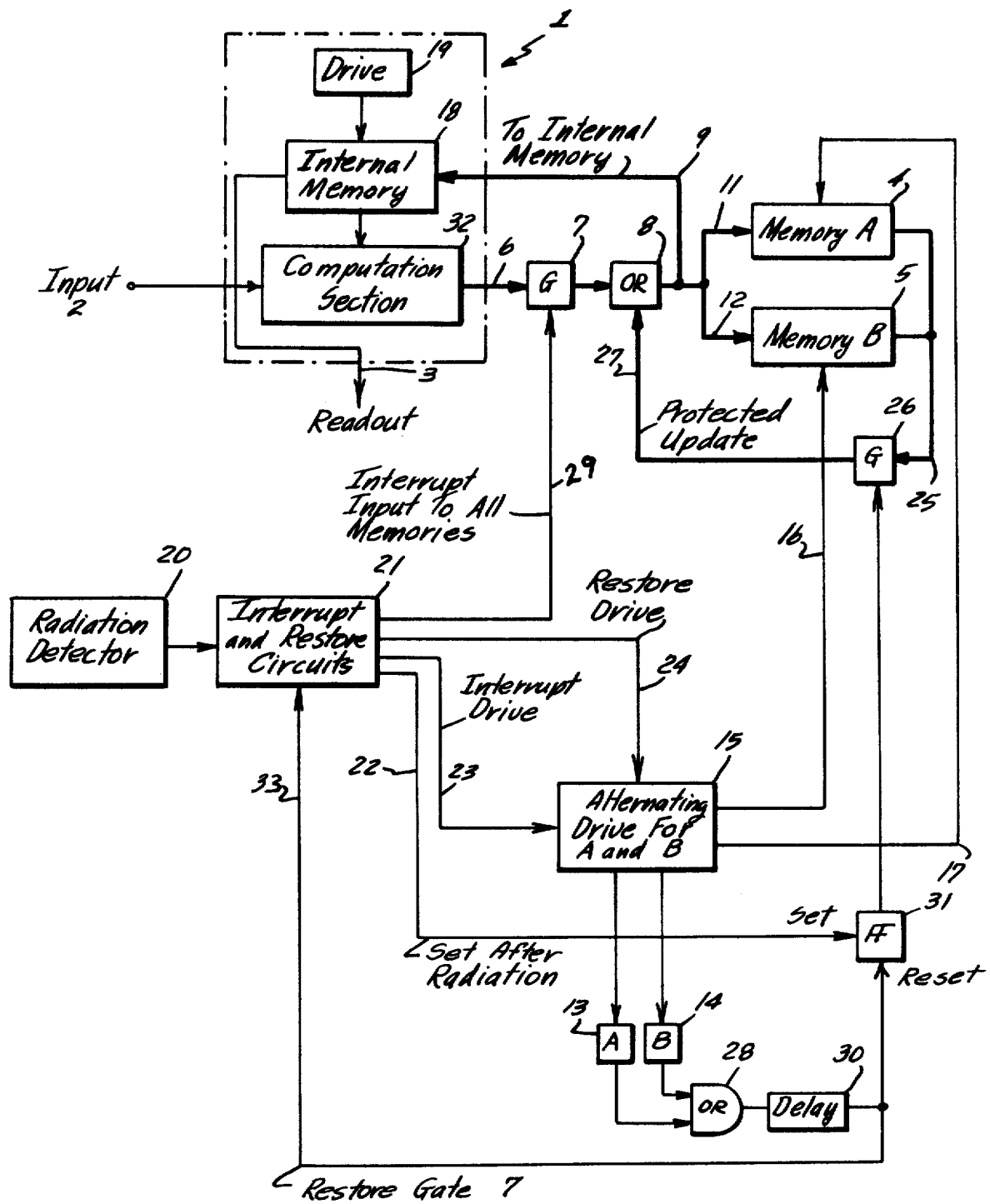

RADIATION CIRCUMVENTION TECHNIQUE

The invention described herein may be manufactured and used by or for the Government of the United States of America for governmental purposes without the payment of any royalties thereon or therefor.

This invention relates to the protection of computer memories from nuclear or other radiation which, although it does not physically destroy the memory elements, causes information recorded in the memory to be lost either through massive overloading or through spurious signal injection.

This type of memory loss is one of the tactical defenses to internally guided ballistic missiles. Memory loss is induced by producing radiation which either damages the guidance system elements or causes false information to be injected into the guidance computer memory. This radiation may be X-ray, gamma ray or beta radiation generated by a nuclear explosion in the vicinity of an incoming missile. The present invention, although not limited to missile protection, provides the missile guidance computer with a method of circumventing its memory during the period of radiation and restoring this memory to the state it held immediately before the onset of radiation.

Present missile guidance computers are vulnerable to catastrophic upset and loss of information due to transient ionizing radiation from nuclear weapons bursts. The present invention renders the computer invulnerable to the transient effect of these bursts short of permanent damage. This circumvention technique operates on the assumption that information stored in a magnetic core memory is invulnerable to nuclear radiation levels up to those levels at which permanent damage occurs in electronics. This assumption is warranted at least insofar as magnetic core or wire memories are concerned.

At any one time, the information contained in the computer system is either "stored" information or information "in the process of transfer." It is possible to prevent "stored" information from becoming affected by ionizing radiation by isolating the unit containing this information from further inputs when the radiation is present. This "stored" information is therefore designated "safe." Information which is "in the process of transfer" may be affected by ionizing radiation and is therefore designated "vulnerable." This information is "vulnerable" since it must be transmitted by an electrical signal which may be altered in either amplitude or duration by ionizing radiation.

Circumvention is accomplished by use of pairs of redundant memories. Each pair of redundant memories corresponds to an identical memory in the computer. In missile guidance computers, these memories are shift registers. If the computer uses other types of storage devices, it is this type of storage device which is redundantly twice duplicated.

In the case of missiles, the most important computer function is the control of the flight trajectory. Data for the flight trajectory computer is usually stored in a register within the computer. In order to preserve the data in this register during transient radiation, two redundant magnetic storage registers are fed in parallel with the internal computer register. The redundant registers are controlled so that one of the pair is "protected" in that no current or pulses are applied to its core windings while the other of the pair is being updated. These two redundant memories are alternately updated and protected in rapid succession so that no information is lost.

These pairs of redundant memories thus duplicate the internal memory of the computer and are fed in parallel therewith with the exception that only one of the redundant memories is provided with information at one time. The redundant memories are addressed or activated cyclically in rapid succession such that at any given time one of the redundant memories will be isolated from all inputs and will thus be preserving data while the other is being updated. When nuclear radiation is first sensed, there will be one redundant memory which is preserving data. This is the data received in the last completed cycle occurring before the onset of ionizing radiation. Since all redundant memories are isolated by the sensing of the radiation burst, information is preserved by the memory which was addressed in the last completed cycle just prior to the burst. When the radiation has ceased, this memory is located and the protected data in this memory is recycled back to the internal memory of the computer. During the period of radiation, the internal computer memory is erased or blanked; and, when the radiation ceases, this blanked memory is updated by the information in the protected memory.

This circumvention technique thus consists of a computer having an internal memory; two redundant memories; an alternating drive circuit which alternatively addresses each of the redundant memories; a radiation sensor; and interrupt circuits responsive thereto for isolating the redundant memories from further misinformation, for identifying the protected memory, and for returning the internal computer memory to its initial state after the radiation has ceased.

It will be appreciated that the subject protection circuit while having application in missile systems is not limited thereto but is applicable in any situation where either a general purpose or special purpose computer may be subjected to transient ionizing radiation.

It is an object of this invention to provide a method and apparatus for protecting information stored in a computer during such time as the computer is subjected to ionizing radiation.

It is another object of this invention to provide a system which inactivates or circumvents a computer during a burst of transient ionizing radiation by providing a pair of redundant memory elements for each memory element in the computer and for sequentially addressing each of these pair of elements such that when transient ionizing radiation is sensed one of these memory elements will have information which will have been unaffected by the radiation.

It is still another object of this invention to provide a method for protecting information stored in a computer memory by redundantly recording the information in two alternately addressed memories, by isolating both memories during a period of transient ionizing radiation, and by reading out that memory which is unaffected by this radiation due to the fact that at the onset of this ionizing radiation this memory was not addressed.

Other objects, advantages and novel features of the invention will become apparent from the following detailed description thereof when considered in conjunction with the accompanying drawing in which like numerals represent like parts throughout and wherein the FIGURE represented in this drawing is a block diagram showing a special purpose computer in which the subject circumvention technique is used.

As recited hereinbefore, the effects of radiation bursts are circumvented by interrupting the flow of "transferred" information within the computer system. Information "stored" and isolated in the computer system prior to the burst will not be subjected to updating by spurious information. This invention provides areas of storage in the computer system which can be isolated sufficiently prior to the onset of transient ionizing radiation so that this stored information will be completely unaffected by a transfer of spurious information. These areas of storage are isolated in advance of the radiation by providing at least two redundant memories which are alternately addressed. The cycle of alternation may either be rapid, where rapid computation is required, or may be relatively slow, when only intermittent computations are called for.

In many military applications, the cycle of alternation must be rapid since many military computers are subject to continuous updating requirements. These applications occur most frequently in guidance, control and tracking situations in which mobile computers are used in guiding a vessel or missile, in fire control and target acquisition or in any operation where variables to be computed are changing rapidly. This usually requires a special purpose computer. One such type of special purpose computer which can be hardened against nuclear blasts is shown in the sole FIGURE.

In this figure a computer 1 is shown composed of a computation section 32, an internal memory 18 and memory drive circuitry 19. Computer 1 has inputs designated at 2 and a readout designated by arrow 3. It is internal memory 18 in which digital information is stored that is duplicated by redundant memories 4 and 5, labeled memories A and B, respectively. In the normal operation of the computer, inputs 2 are read into the computation section of computer 1 at which point computations are made. The resulting computed data is transmitted from computer 1 to gate 7 as indicated by arrow 6. From gate 7, which is normally gated ON, this information passes through OR gate 8 and is thereafter read into both internal memory 18 by feedback loop 9 and simultaneously transmitted to redundant memories 4 and 5 through circuits 11 and 12.

Redundant memories A and B are alternately addressed or actuated by alternating drive unit 15 so that they alternately store this computed data. The frequency of alternation depends on the type of memories used. If the memories are shift registers, the alternating drive is recycled at a frequency corresponding to the inverse of the time necessary to move a bit of information from one end of the shift register to the other. The redundant memories are alternately actuated by addressing signals, such as shift and write pulses, generated by alternating drive unit 15, which are coupled to redundant memories 4 and 5 through circuits designated 16 and 17.

When transient radiation is generated by, for instance, a nuclear explosion, radiation detector 20, which is designed to be about 50 times more sensitive to radiation than all other circuits, activates interrupt and restoring circuits 21 when radiation above a predetermined background level is sensed. These interrupt and restoring circuits are activated by the outputs from conventional threshold detecting circuits in detector 20 (not shown) and produce biasing voltages in response to whether or not this threshold has been exceeded. These biasing voltages are applied or removed from gates, flip flops or other activating circuits to be described hereinafter which provides for the interrupt and restoring functions. The functions of the interrupt circuits are as follows. When radiation is detected, interrupt circuit 21 turns gate 7 OFF by removing a biasing voltage on gate 7 which is normally supplied through interrupt circuit 29. This interrupts the input both to internal memory 18 of computer 1 and to redundant memories 4 and 5, thus isolating these memories from any further input. At the time of the onset of ionizing radiation, misinformation in the form of incorrect computed data is being "transferred" both to the internal memory and into one of the two redundant memories depending on which of the redundant memories is activated at this time. This "transferred" information is "vulnerable" to ionizing radiation. At the time of the burst, the internal memory and this activated redundant memory will be registering inaccurate or false information. The other redundant memory, however, will be dormant. At the time of the onset of radiation, both the internal memory and one redundant memory will be active because both the drive circuit 19 to the internal memory and alternating drive unit 15 to this redundant memory will be instructing these memories to write, shift and transfer and will, in general, be addressing these memories with instructions to take the information generated at output 6 of the computer and record it. The dormant memory at this time will not have these command signals and thus will not be recording the misleading or false information. This memory is designated as the "safe memory" and will thus have protected, updated data.

At the onset of the radiation, interrupt circuit 21 isolates the redundant memories by interrupting the alternating drive unit 15 through circuit 23. This corresponds to interrupting the operating function of the drive circuit and usually means that the timing generator for the alternating drive is shut down and the outputs 16 and 17 are clamped. This effectively isolates both redundant memories 4 and 5 during the duration of the radiation as detected by radiation detector 20. When the radiation drops below a predetermined threshold as detected by radiation detector 20, interrupt circuit 21 restores the function of drive unit 15, thus allowing other circuitry to gate the output of the "safe" memory through output circuit 25 and gate 26 to update circuit 27. After the internal memory has been updated, interrupt circuit 21 restores gate 7 to a pass condition which then allows normal operation of the computer to continue.

In order to determine which of the memories is safe, alternating drive unit 15 generates a flag bit at the end of each of its alternating cycles. This bit is recorded in either one-bit register 13 or one-bit register 14 which correspond to memories A and B, respectively. A "1" is stored in these one-bit memories on the last bit of each memory store cycle. For example, after the last bit has been written into memory A, the tag bit register has a "1" written into it. This "1" will remain in tag register A until memory A is again activated, at which time it will be cleared to "0". The object is to have memory A or B tagged as the safe memory. To accomplish this, a one-bit register is tagged with a "1" at the beginning of the dormant state of its memory and is cleared to a "0" at the beginning of each active state. Thus, a "1" in the tag bit register indicates a dormant or safe memory; and "0" indicates that the memory was active during the ionizing radiation. When the radiation has dropped below a given threshold, interrupt circuit 21 sets flip flop 31 which opens gate 26; and alternating drive unit 15 is restored to operation by a pulse through circuit 24. Once the alternating drive unit is restored to operation, one of the memories will be initially read out through gate 26. Gate 26, which is blocked during normal operation, is simultaneously placed in a pass condition when the redundant memories are being read out. This pass or block condition is determined by flip flop 31 which is set whenever the radiation has dropped below a given threshold. This threshold is established by interrupt and restore circuits 21. When flip flop 31 is set, a voltage appears at the output of flip flop 31 to place gate 26 in a pass condition. The tag register corresponding to the memory being read out is also read out at the beginning of the readout of this memory. If a "1" is in the tag register, which indicates that this memory was dormant or safe, this is detected by delay circuit 30 and resets flip flop 31 at the end of the readout of this memory. The delay time of the delay circuit is exactly one full memory cycle so that gate 26 is returned to a blocking condition in time to prevent the next and usually vulnerable memory from being read into the internal memory.

If the tag register was not a "1", indicating that the memory may contain vulnerable information and that the other memory was safe, then flip flop 31 will remain set and hence gate 26 will remain in a pass condition. The "vulnerable" information will first be read out through gate 26 followed by safe information from the other memory. This safe information will erase the "vulnerable" information and substitute "safe" information in the internal memory. Thus, after the vulnerable memory has been read out, the safe memory will be read out and passed through gate 26 to update the internal computer memory with the correct information. When the safe memory is first beginning to be read out, its tag register will contain a "1" which will be delayed and sent to flip flop 31 to reset it at the end of the "safe" memory read cycle. The resetting of flip flop 31 blocks gate 26 which prevents the vulnerable memory from again being read out. With flip flop 31 reset, gate 26 inhibits the passage of either memory through gate 26 until the next detection of radiation by radiation detector 20. In the event that the computer experiences radiation for the short interval where both one-bit registers contain a "1", it is true that both redundant memories are valid. Thus, the information in the protected memory updates the information in the internal computer memory after the radiation thereat has passed.

The internal memory of the computer at the onset of ionizing radiation will have been updated by false information. After the onset of this radiation, internal memory 18 will register a series of zeros since no input information is being transmitted to it because gate 7 is blocked and because write, shift and transfer commands generated by drive 19 to the internal memory will not be interrupted by the subject system. Thus, the internal memory will continue to write, shift and transfer any information that appears at its input. Since the input to the memory is interrupted during the time of radiation, only a series of zeros will appear in the internal memory. Thus, any information residing in the internal memory at the time of the onset of radiation is erased.

The protected update is applied to a blanked memory through circuit 9 when the ionizing radiation has ceased. When the internal memory has been updated, its information may be dumped into computation section 32 to establish a data base from which to compute new data. This new data is formed from the interaction of parameters entering this section at input 2 with the new data base. Signals from input 2 to the computation section arrive during the occurrence of radiation, but any computations made in this section are blocked by gate 7 as they emerge during the time that radiation is sensed. Gate 7 is opened after the radiation has ceased by interrupt circuits 21 so that the normal operation of the computer can continue. This gate is opened a predetermined time after the cessation of radiation to allow time to update the internal memory with the correct data. In the subject embodiment, gate 7 is opened when the last bit of the "safe" memory has been read into the internal memory as indicated when a reset pulse is delivered to flip flop 31. Gate 7 is opened by the application of a bias from circuit 21 operating in response to the occurrence of this reset pulse as delivered to circuit 21 by circuit 33. After the "safe" information has been dumped into the internal memory, input 27 to OR gate 8 is blocked at gate 26 by the resetting of flip flop 31. This blocks any further information from the redundant memories and allows the internal memory to be updated from the computation section. Thus, OR gate 8 is presented with only one of three possible inputs: the output of computation section 32 during normal operation; no inputs during radiation; and the protected update from gate 26 immediately after cessation of radiation. This protected update is maintained at gate 8 until the last bit from the "safe" memory has been transferred.

Although the subject invention has been described with respect to a special purpose computer having shift registers as its memory, the circumvention technique can be used with a computer which has any type of permanent storage memory. Essentially, in any circumvention technique in which the subject system is used, the drive circuitry for the redundant memories must be interrupted at the time of the onset of ionizing radiation so that the alternately addressed redundant memories will be isolated. At the same time, the input to the internal memory must be interrupted and its contents erased. After this has been accomplished, the "safe" memory is located and its information dumped into the erased internal memory. Thereafter, the original computation cycle is restored to the computer system. The types of circuits which can perform these alternate addressing, interrupting, and restoring functions are well known and are thus not described in detail.

What is claimed is:

1. Apparatus for circumventing the effects of ionizing radiation on a computer having a radiation-resistant internal memory into which information can be written which will be unaffected by ionizing radiation levels below the level at which electrical components of the memory are physically damaged, comprising:
   a pair of radiation-resistant memory units into which can be written information which will be unaffected by ionizing radiation below the level at which said physical damage occurs;
   means for transferring information simultaneously to the inputs of said memory units and the input of said internal memory so that said pair of units are fed in parallel with said internal memory;
   means for alternately driving said memory units so as to have the information available at their inputs recorded in first one and then the other of said memory units such that only one of said units is recording the transferred information during any one recording cycle, each of said units being in a dormant state during the recording cycle of the other of said memory units;

means at said computer responsive to the presence of ionizing radiation above a predetermined background level for isolating said memory units from any further input;

means for determining which of said memory units was dormant at the onset of radiation above said predetermined background level and which therefore contains information unaffected by said radiation; and means coacting with said driving means for transferring the information in that unit which was dormant to the internal memory of said computer after said radiation falls below said predetermined background level so that the internal memory of said computer is updated with information unaffected by said ionizing radiation.

2. The apparatus as recited in claim 1 wherein said means for isolating said memory units from any further input includes means for interrupting the transfer of information to all of said memories and means for shutting down and clamping the output of said driving means during the occurrence of radiation above said predetermined background level.

3. The apparatus as recited in claim 1 and further including means for restoring the normal operation of said computer after the information in the dormant unit has been transferred to said internal memory.

4. The apparatus as recited in claim 1 wherein said memory units are identical to the internal memory of said computer.

5. Apparatus for circumventing the effects of ionizing radiation on a computer having a radiation-resistant internal memory into which information can be written which will be unaffected by transient ionizing radiation levels below the level at which physical damage occurs to the electrical components in said memory, comprising a pair of radiation-resistant memories which are likewise unaffected by transient ionizing radiation below said level and which are fed in parallel with said internal memory, said pair of memories being alternately addressed in such a manner that information available at the input to each memory is recorded in first one and then the other of said memories during alternate recording cycles, the memory which is not addressed being dormant during the recording cycle in which the other memory is addressed;

means at said computer for detecting the presence of ionizing radiation above a predetermined residual background level;

means for isolating both of said memories from further addressing and informational inputs in response to the detection of radiation exceeding said predetermined background level; and means for ascertaining which of said memories was dormant when the detected radiation level exceeded said predetermined background level and for transferring the information in this dormant memory to the internal memory of said computer as soon as the detected radiation level drops below said predetermined background level such that the internal memory of said computer is updated with information which is unaffected by said ionizing radiation, whereby said computer can be restored to normal operation after the occurrence of a burst of ionizing radiation in the vicinity of said computer.

* * * * *